United States Patent
Yang et al.

(10) Patent No.: US 12,367,925 B2
(45) Date of Patent: *Jul. 22, 2025

(54) STATIC RANDOM ACCESS MEMORY LAYOUT

(71) Applicant: Taiwan Semiconductor Manufacturing Company, Ltd., Hsinchu (TW)

(72) Inventors: Chih-Chuan Yang, Hsinchu (TW); Jui-Wen Chang, Hsinchu (TW); Feng-Ming Chang, Zhubei (TW); Kian-Long Lim, Hsinchu (TW); Kuo-Hsiu Hsu, Zhongli (TW); Lien Jung Hung, Taipei (TW); Ping-Wei Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/418,779

(22) Filed: Jan. 22, 2024

(65) Prior Publication Data

US 2024/0203486 A1 Jun. 20, 2024

Related U.S. Application Data

(63) Continuation of application No. 17/662,364, filed on May 6, 2022, now Pat. No. 11,942,145.

(Continued)

(51) Int. Cl.
*G11C 5/02* (2006.01)
*G11C 11/417* (2006.01)
(Continued)

(52) U.S. Cl.
CPC .......... *G11C 11/417* (2013.01); *H10B 10/125* (2023.02); *H10D 30/6735* (2025.01)

(58) Field of Classification Search
CPC ....... G11C 5/063; G11C 7/18; G11C 11/4097; G11C 5/025; G11C 5/04
(Continued)

(56) References Cited

U.S. PATENT DOCUMENTS 9,142,284 B2 9/2015 Lee et al.
10,170,484 B1 1/2019 Sung et al.
(Continued)

FOREIGN PATENT DOCUMENTS

TW    I613650 B    2/2018
TW    202010090 A  3/2020
(Continued)

OTHER PUBLICATIONS

Notice of Allowance, dated Nov. 15, 2023, Taiwan Intellectual Property Office Appl. No. 111125870, 4 pages.

*Primary Examiner* — Son T Dinh
(74) *Attorney, Agent, or Firm* — Sterne, Kessler, Goldstein & Fox P.L.L.C.

(57) ABSTRACT

The present disclosure describes a method for memory cell placement. The method can include placing a memory cell region in a layout area and placing a well pick-up region and a first power supply routing region along a first side of the memory cell region. The method also includes placing a second power supply routing region and a bitline jumper routing region along a second side of the memory cell region, where the second side is on an opposite side to that of the first side. The method further includes placing a device region along the second side of the memory cell (Continued)

region, where the bitline jumper routing region is between the second power supply routing region and the device region.

20 Claims, 10 Drawing Sheets

Related U.S. Application Data

(60) Provisional application No. 63/222,580, filed on Jul. 16, 2021.

(51) Int. Cl.
*H10B 10/00* (2023.01)
*H10D 30/67* (2025.01)

(58) Field of Classification Search
USPC ..................................... 365/51, 63
See application file for complete search history.

(56) References Cited

U.S. PATENT DOCUMENTS

| | | |
|---|---|---|
| 10,332,881 B1 | 6/2019 | Badaroglu et al. |
| 10,867,681 B2 | 12/2020 | Clinton et al. |
| 11,942,145 B2 * | 3/2024 | Yang .................. H10B 10/125 |
| 2013/0187233 A1 | 7/2013 | Yun et al. |
| 2018/0174959 A1 * | 6/2018 | Kim .................. H01L 23/5226 |
| 2022/0359536 A1 | 11/2022 | Yang et al. |

FOREIGN PATENT DOCUMENTS

| | | |
|---|---|---|
| TW | 202030865 A | 8/2020 |
| TW | 202101453 A | 1/2021 |

* cited by examiner

STATIC RANDOM ACCESS MEMORY LAYOUT

CROSS-REFERENCE TO RELATED APPLICATION

This application is a continuation of U.S. patent application Ser. No. 17/662,364, titled "Static Random Access Memory Layout," which was filed on May 6, 2022, which claims the benefit of U.S. Provisional Patent Application No. 63/222,580, titled "Tapless Edge for SRAM Macro Speed Gain and Dimension Shrink," which was filed on Jul. 16, 2021, both of which are incorporated herein by reference in their entireties.

BACKGROUND

Static random access memory (SRAM) is a type of semiconductor memory used in computing applications that require, for example, high-speed data access. For example, cache memory applications use SRAM to store frequently-accessed data—e.g., data accessed by a central processing unit.

The SRAM's cell structure and architecture enable high-speed data access. The SRAM cell can include a bi-stable flip-flop structure with, for example, four to ten transistors. An SRAM architecture can include one or more arrays of memory cells and support circuitry. Each of the SRAM arrays is arranged in rows and columns called "wordlines" and "bitlines," respectively. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
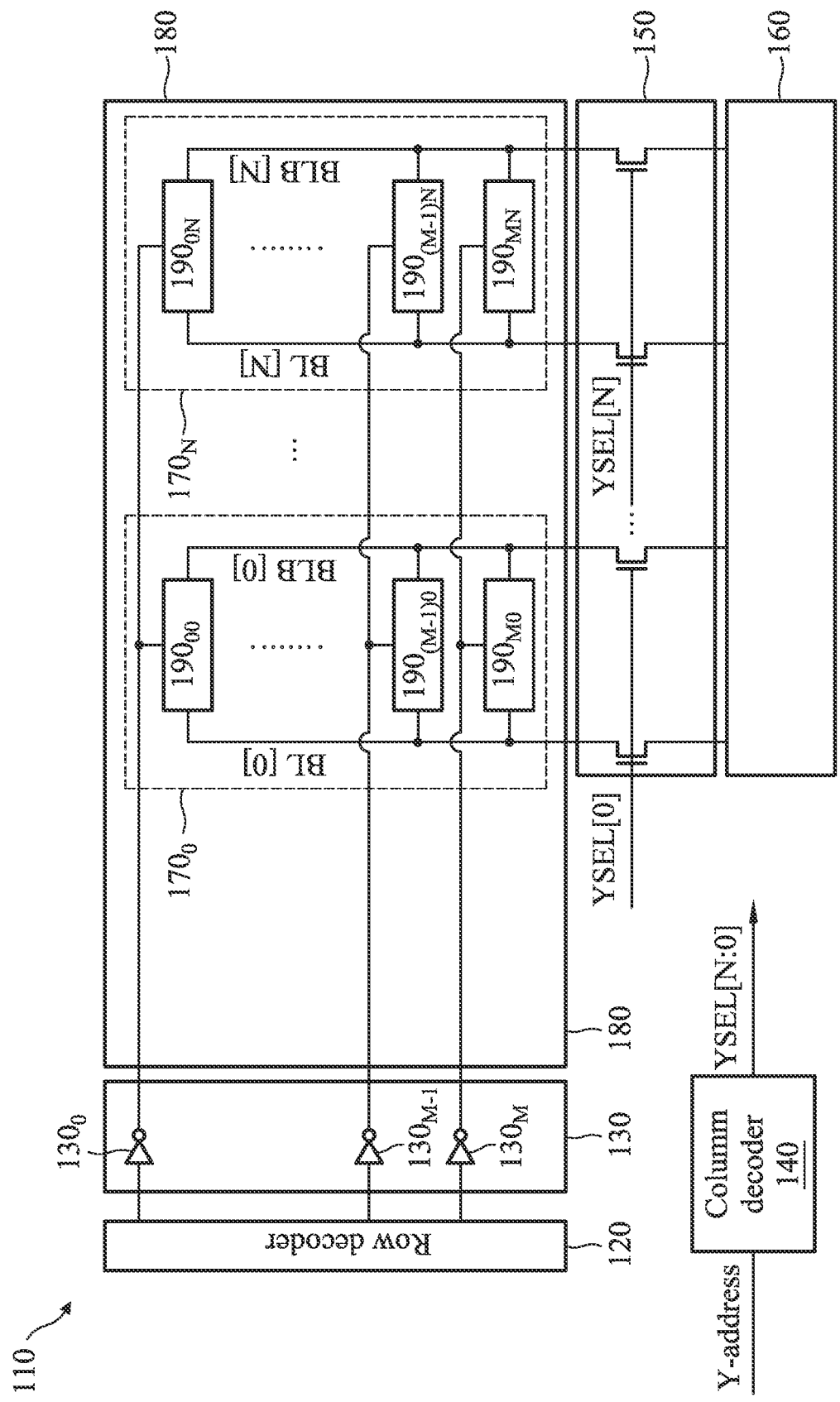
FIG. 1 is an illustration of a static random access memory with a memory cell power supply, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The following disclosure describes aspects of a static random access memory (SRAM). Specifically, the disclosure describes different embodiments related to an SRAM cell layout. For ease of explanation, certain SRAM circuit elements and control circuits are disclosed to facilitate in the description of the different embodiments. The SRAM can also include other circuit elements and control circuits. These other circuit elements and control circuits are within the spirit and scope of this disclosure.

FIG. 1 is an illustration of a static random access memory (SRAM) device 100, according to some embodiments of the present disclosure. SRAM device 100 also includes a row decoder 120, a wordline driver 130, a column decoder 140, a column multiplexer (MUX) 150, a read/write circuit 160, and an SRAM array 180. SRAM array 180 includes columns of SRAM cells $170_0$-$170_N$.

Each of the SRAM cells in SRAM array 180 is accessed—e.g., for memory read and memory write operations—using a memory address. Based on the memory address, row decoder 120 selects a row of memory cells to access via wordline driver 130. Also, based on the memory address, column decoder 140 selects a column of memory cells $170_0$-$170_N$ to access via column MUX 150. For a memory read operation, read/write circuit 160 senses a voltage level on bitline pairs BL/BLB. For a memory write operation, read/write circuit 160 generates voltages for bitline pairs BL/BLB in columns of memory cells $170_0$-$170_N$. The notation "BL" refers to a bitline, and the notation "BLB" refers to the complement of BL. The intersection of the accessed row and the accessed column of memory cells results in access to a single memory cell S.

Each of columns of memory cells $170_0$-$170_N$ includes memory cells 190. Memory cells 190 can be arranged in one or more arrays in SRAM device 100. In the present disclosure, a single SRAM array 180 is shown to simplify the description of the disclosed embodiments. SRAM array 180 has "M" number of rows and "N" number of columns. The notation "$190_{00}$" refers to memory cell 190 located in row '0', column $170_0$. Similarly, the notation "$190_{MN}$" refers to memory cell 190 located in row 'M', column $170_N$.

Figure 2:
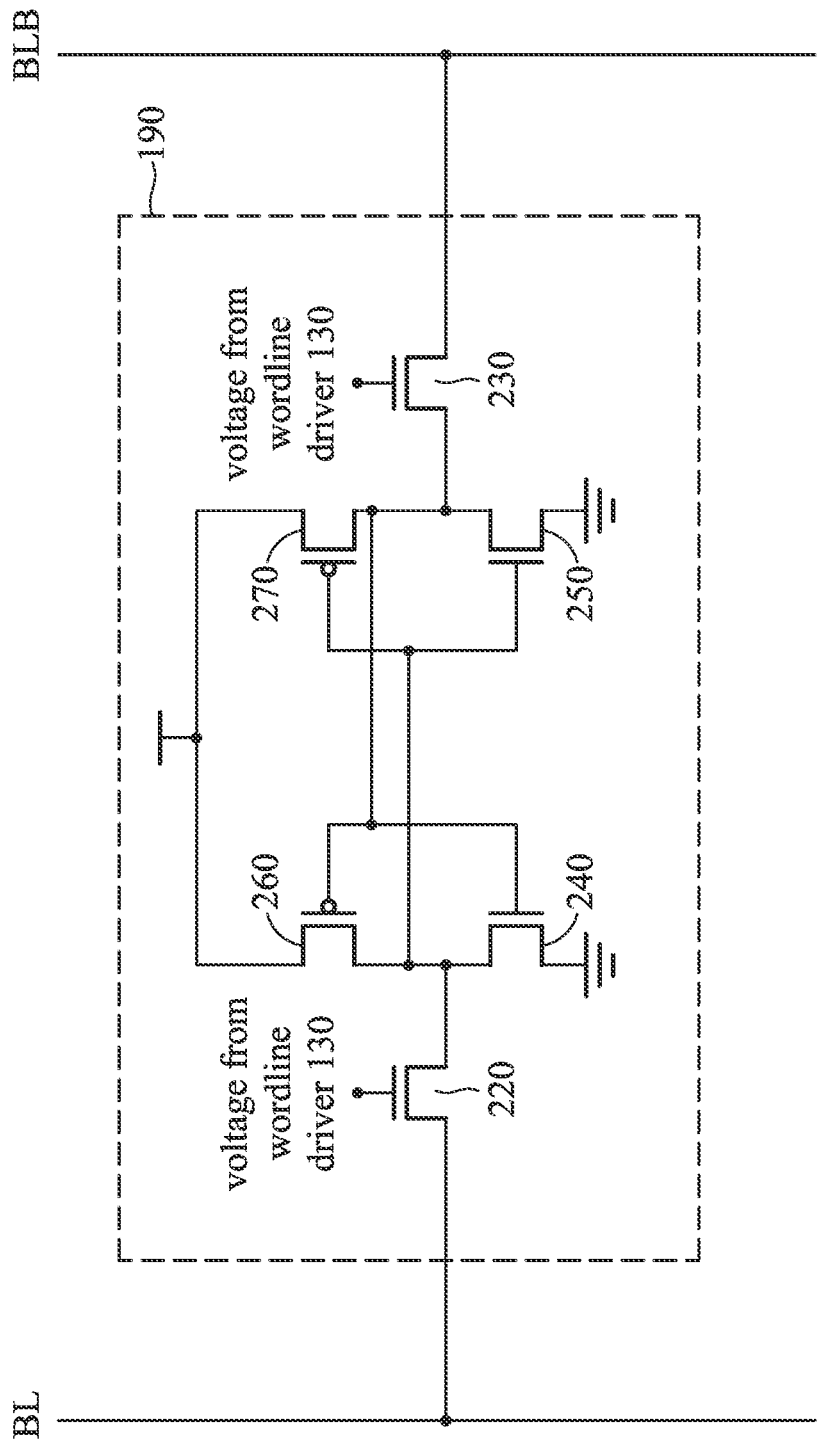
FIG. 2 is an illustration of a static random access memory circuit topology with a memory cell power supply, according to some embodiments of the present disclosure.

In some embodiments, memory cell 190 can have a six transistor ("6T") SRAM circuit topology. FIG. 2 is an illustration of an example 6T SRAM circuit topology for memory cell 190. The 6T SRAM circuit topology includes n-type field effect transistor (NFET) pass devices 220 and 230, NFET pull-down devices 240 and 250, and p-type FET (PFET) pull-up devices 260 and 270. The FET devices (e.g., NFET devices and PFET devices) can be planar metal-oxide-semiconductor FETs, finFETs, gate-all-around FETs, any suitable FETs, or combinations thereof. Other SRAM circuit topologies, such as four transistor ("4T"), eight transistor ("8T"), and ten transistor ("10T") SRAM circuit topologies, are within the spirit and scope of the present disclosure.

A voltage from wordline driver 130 controls NFET devices 220 and 230 to pass voltages from the bitline pair BL/BLB to a bi-stable flip-flop structure formed by NFET devices 240 and 250 and PFET devices 260 and 270. The bitline pair BL/BLB voltages can be used during a memory read operation and a memory write operation. During the memory read operation, the voltage applied by wordline driver 130 to the gate terminals of NFET pass devices 220 and 230 can be at a sufficient voltage level to pass a voltage stored in the bi-stable flip-flop structure to the BL and BLB, which can be sensed by read/write circuit 160. For example, if a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage) is passed to the BL and a '0' or a logic low value (e.g., ground or 0 V) is passed to the BLB, read/write circuit 160 can sense (or read) these values. During the memory write operation, if the BL is at a '1' or a logic high value and the BLB is at a '0' or a logic low value, the voltage applied by wordline driver 130 to the gate terminals of NFET pass devices 220 and 230 can be at a sufficient voltage level to pass the BL's logic high value and the BLB's logic low value to the bi-stable flip-flop structure. As a result, these logic values are written (or programmed) into the bi-stable flip-flop structure.

Figure 3:
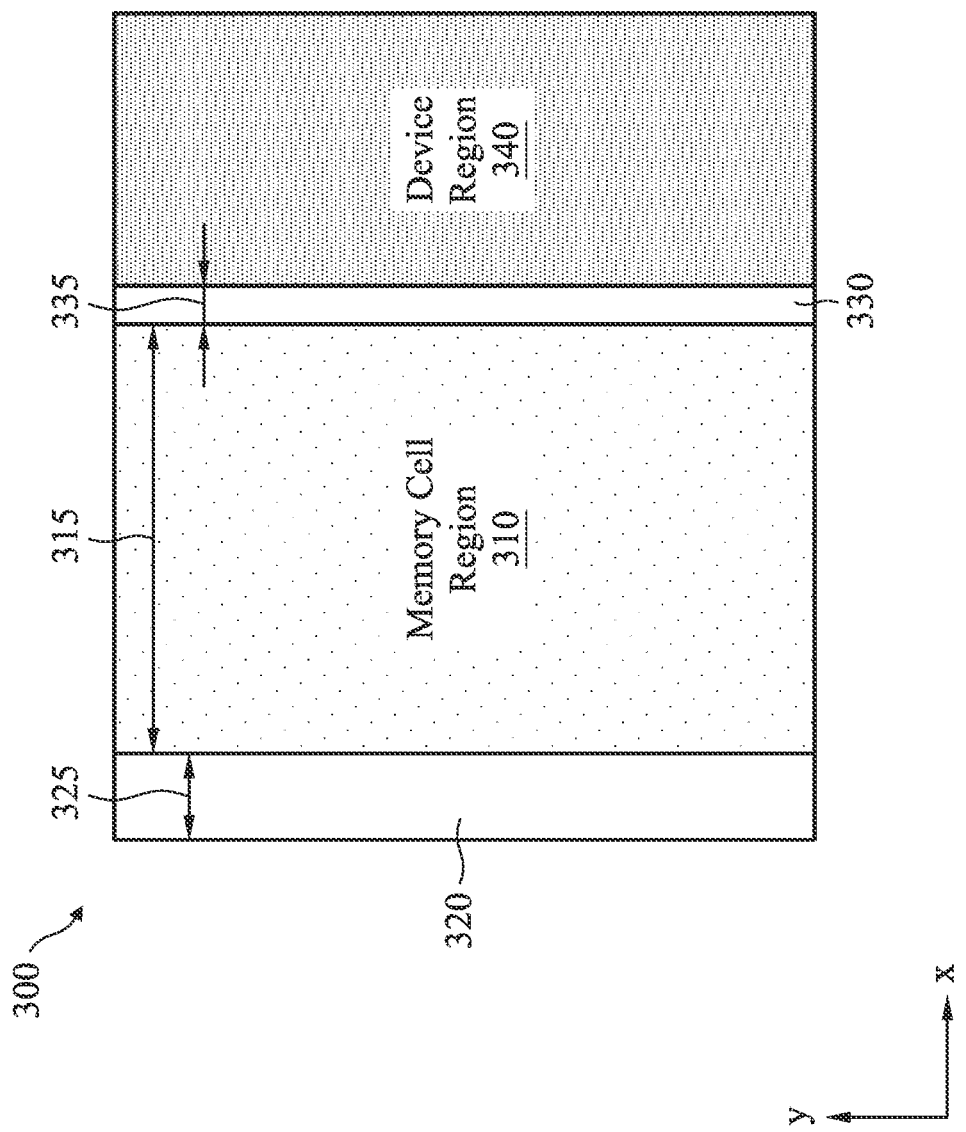
FIG. 3 is an illustration of a layout floorplan for a portion of a static random access memory device, according to some embodiments of the present disclosure.

FIG. 3 is an illustration of a layout floorplan 300 for a portion of SRAM device 100, according to some embodiments of the present disclosure. Layout floorplan 300 includes a memory cell region 310, a first side 320 of memory cell region 310, a second side 330 of memory cell region 310, and a device region 340. In some embodiments, layout floorplan 300 can represent a portion of a larger layout floorplan, such as a floorplan of an entire chip or system design.

Memory cell region 310 includes multiple memory cells arranged in an array format, according to some embodiments of the present disclosure. In some embodiments, each of the memory cells in memory cell region 310 can be memory cell 190 of FIG. 2. Each of the PFETs and NFETs in memory cell 190 can be gate all-around field effect transistors (GAA FETs), according to some embodiments of the present disclosure. In some embodiments, memory cell region 310 can have a width 315 (e.g., in the x direction) from about 32 contacted poly pitch (CPP) to about 64 CPP. The term "contacted poly pitch (CPP)" can refer to a transistor's gate pitch in layout—e.g., the gate pitch in the layout of the gate all-around FETs in memory cell 190 of FIG. 2—in which the gate pitch can depend on a semiconductor process technology node implemented to manufacture the transistors. The semiconductor process technology node can include a 16 nm technology node, a 14 nm technology node, a 10 nm technology node, a 7 nm technology node, a 5 nm technology node, a 3 nm technology node, a 2 nm technology node, a 1 nm technology node, and smaller technology nodes.

The number of memory cells in memory cell region 310 can depend on one or more design parameters of SRAM device 100, according to some embodiments of the present disclosure. In some embodiments, the number of memory cells in memory cell region 310, such as memory cell 190 of FIG. 2, can depend on a desired bitline loading (e.g., the number of memory cells 190 electrically coupled to a BL and a BLB).

Figure 4:
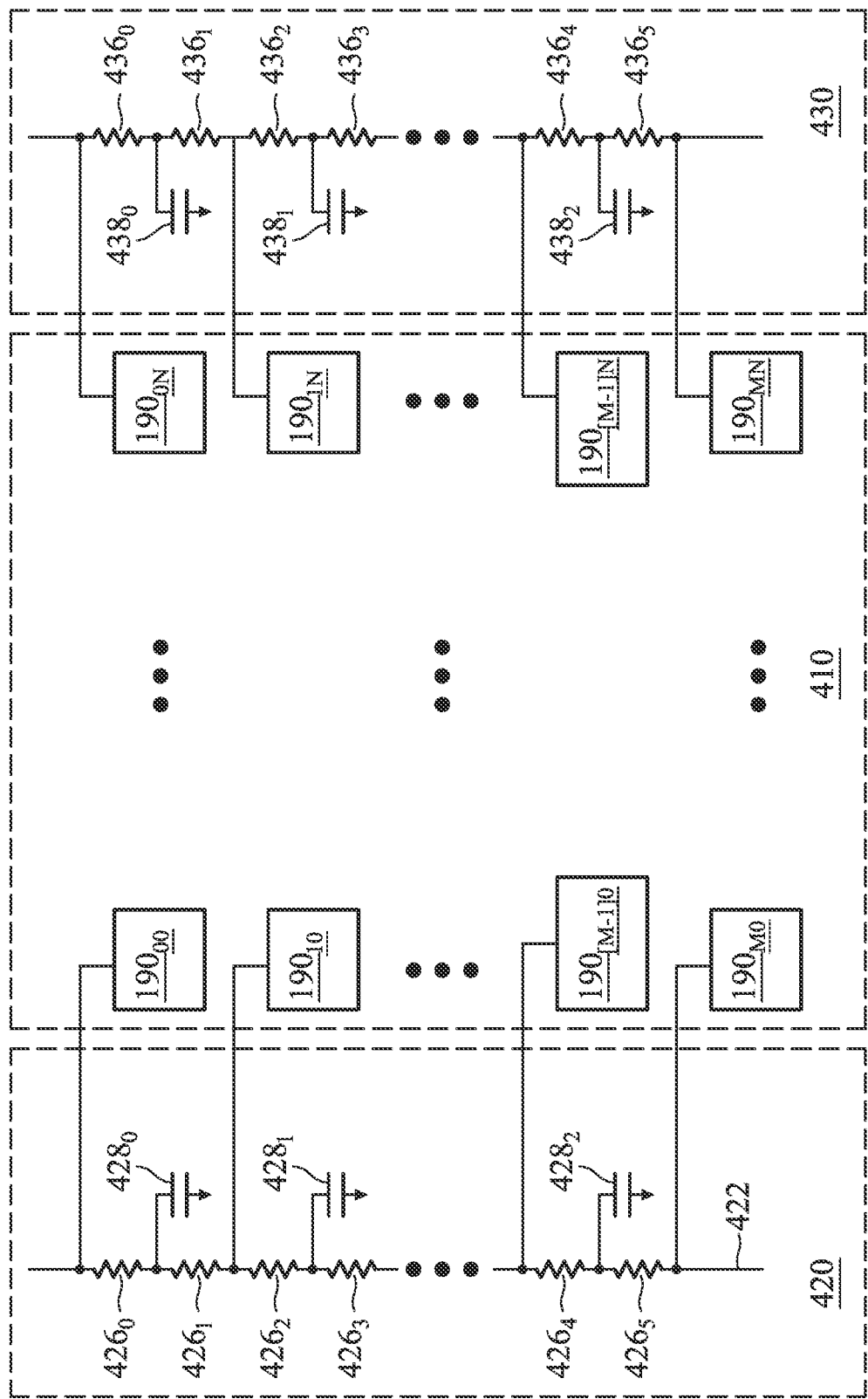
FIG. 4 is an illustration of a static random access memory array with bitline parasitic models, according to some embodiments of the present disclosure.

FIG. 4 is an illustration of SRAM array 410 with bitline parasitic models 420 and 430, according to some embodiments of the present disclosure. SRAM array 410 includes memory cells 190 arranged in an array format having M number of rows and N number of columns—similar to the description above with regard to SRAM array 180 of FIG. 1. For simplicity, bitline parasitic models 420 and 430 illustrate a network of resistors and capacitor elements along two BL paths for memory cells 190: bitline 422 and bitline 432. The description of bitline parasitic models 420 and 430 is applicable to parasitic models for the BLB paths for memory cells 190.

A network of resistor elements $426_0$-$426_5$ and capacitor elements $428_0$-$428_2$ represents bitline parasitic model 420. For example, for bitline 422, two resistor elements $426_0$ and $426_1$ and one capacitor element $428_0$ are between memory cells $190_{00}$ and $190_{10}$. Similarly, a network of resistor elements $436_0$-$436_5$ and capacitor elements $438_0$-$438_2$ represents bitline parasitic model 430. For example, for bitline 432, two resistor elements $436_0$ and $436_1$ and one capacitor element $438_0$ are between memory cells $190_{0N}$ and $190_{1N}$.

Due to the resistor and capacitor elements in bitlines 422 and 432, data read from and written to memory cells 190 can be delayed (also referred to as "a bitline resistive-capacitive (RC) delay), thus degrading the read and write performance of SRAM device 100. Accordingly, the number of memory cells 190 electrically coupled to each of bitlines 422 and 432 affects the read and write performance of SRAM device 100. For example, a higher number of memory cells 190 electrically coupled to each of bitlines 422 and 432 introduces a higher bitline RC delay, thus slowing read and write operations of SRAM device 100.

Figure 5:
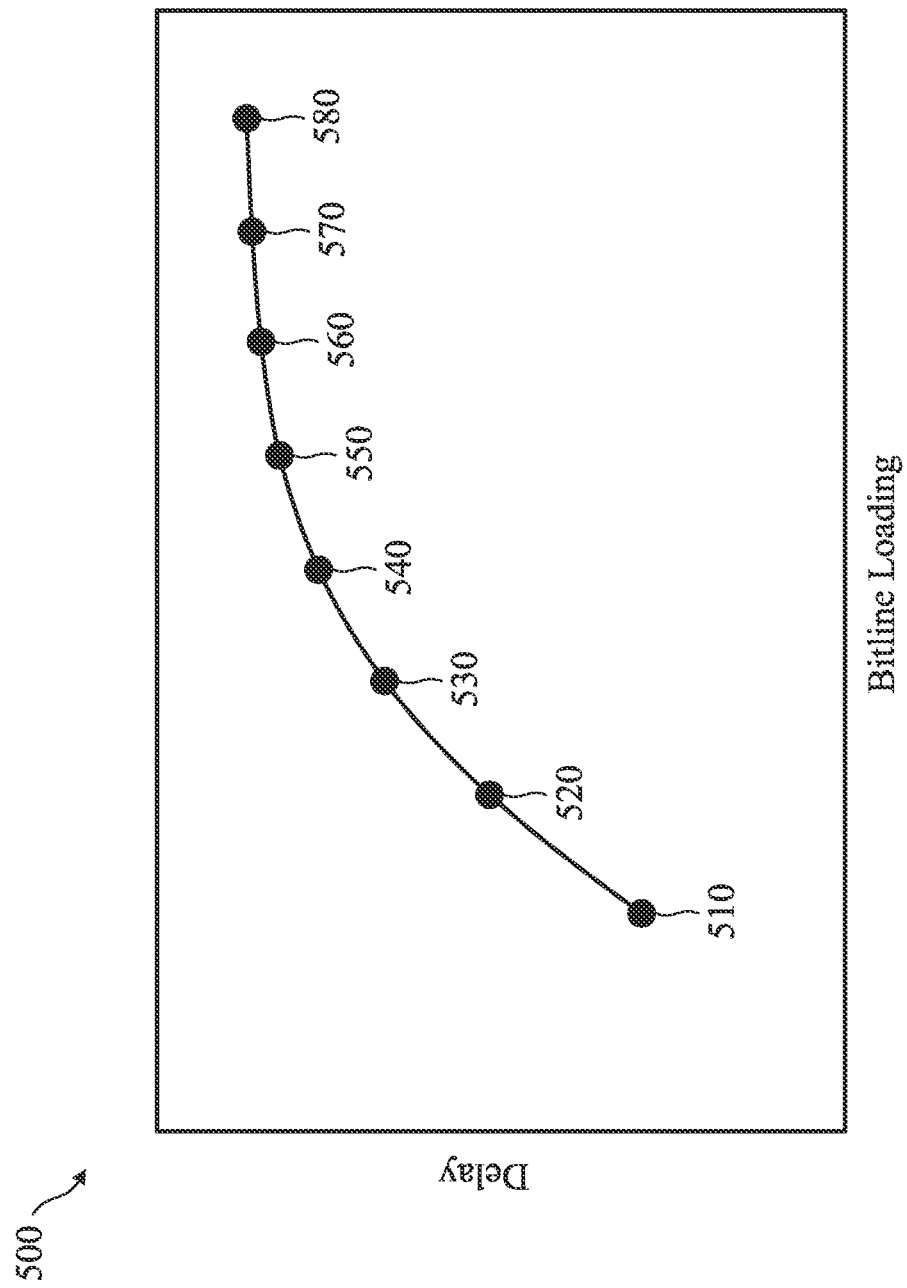
FIG. 5 is an illustration of a graph showing a relationship between delay and bitline loading for a static random access memory device, according to some embodiments of the present disclosure.

FIG. 5 is an illustration of a graph 500 showing a relationship between delay (e.g., bitline RC delay) and bitline loading for SRAM device 100, according to some embodiments of the present disclosure. Data points 510, 520, 530, 540, 550, 560, 570, and 580 can represent 4 memory cells 190, 8 memory cells 190, 16 memory cells 190, 32 memory cells 190, 64 memory cells 190, 128 memory cells 190, 256 memory cells 190, and 512 memory cells 190 electrically coupled to a bitline (e.g., bitline 422 and bitline 432 of FIG. 4), respectively. Graph 500 shows that as the number of memory cells 190 electrically coupled to a bitline (bitline loading) increases, the amount of delay (e.g., bitline RC delay) increases. For example, comparing data point 510 to data point 580, 4 memory cells 190 electrically coupled to a bitline can have about 12% less bitline RC delay than that of 512 memory cells 190. Comparing data point 520 to data point 580, 8 memory cells 190 electrically coupled to a bitline can have about 7% less bitline RC delay than that of 512 memory cells 190. Comparing data point 530 to data point 580, 16 memory cells 190 electrically coupled to a bitline can have about 4% less bitline RC delay than that of 512 memory cells 190. Comparing data point 540 to data point 580, 32 memory cells 190 electrically coupled to a bitline can have about 2% less bitline RC delay than that of 512 memory cells 190. And comparing each of data points 550, 560, and 570 to data point 580, 64, 128, and 256 memory cells electrically coupled to a bitline can have about 1% (or below about 1%) less bitline RC delay than that of 512 memory cells 190.

Referring to FIG. 3, based on a desired bitline loading and device performance, the number of memory cells in cell region 310 can be determined, according to some embodiments of the present disclosure. For example, for improved bitline RC delay and thus improved read and write performance in SRAM device 100, the number of memory cells 190 electrically coupled to a bitline may be 4, 8, 16, or 32. Put differently, 4, 8, 16, or 32 memory cells 190 can be arranged along a height (e.g., in the y direction) of memory cell region 310. Further, depending on width 315 of memory cell region 310 (e.g., in the x direction), a maximum number of memory cells 190 that can fit into width 315 may be desirable to maximize the storage capacity of memory cell region 310, according to some embodiments of the present invention. For example, with width 315 from about 32 CPP to about 64 CPP and assuming a width of memory cell 190 of FIG. 2 of about 5 CPP (e.g., in the x direction), each row of memory cells 190 in memory cell region 310 can include about 6 to about 12 memory cells 190. In summary, in some embodiments, memory cell region 310 can have 4, 8, 16, or 32 rows of memory cells 190 and about 6 to about 12 columns of memory cells 190.

Referring to FIG. 3, first side 320 of memory cell region 310 is located on a far end of memory cell region 310, away from device region 340 (e.g., in the x direction). For example, first side 320 of memory cell region 310 can be located on an outer edge of layout floorplan 300 for SRAM device 100. In some embodiments, first side 320 of memory cell region 310 can have a width 325 (e.g., in the x direction) from about 8 CPP to about 12 CPP. For example, width 325 can be about 10 CPP.

Figure 6:
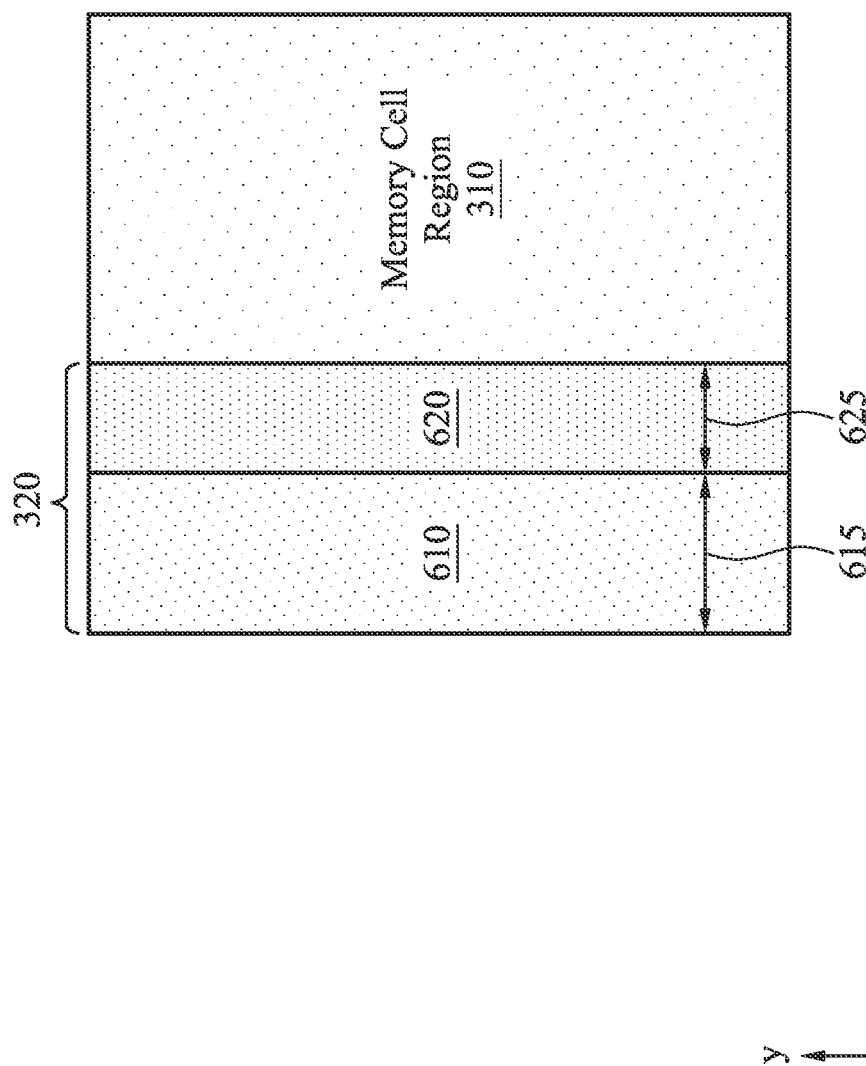
FIG. 6 is an illustration of a first side of a memory cell region in a static random access memory device, according to some embodiments of the present disclosure.

FIG. 6 is an illustration of first side 320 of memory cell region 310, according to some embodiments of the present disclosure. In some embodiments, first side 320 of memory cell region 310 includes a well pick-up region 610 and a power supply routing region 620. Well pick-up region 610 can provide access to n-wells and p-wells underlying the transistors of memory cell 190 of FIG. 2—e.g., NFET pass devices 220 and 230, NFET pull-down devices 240 and 250, and PFET pull-up devices 260 and 270. The transistors of memory cell 190 can be GAA FETs, according to some embodiments of the present disclosure. Access to the n-wells and p-wells can be through contact structures (e.g., p-well contact and n-well contacts) for manufacturing testing and normal operation of SRAM device 100 (e.g., integrated circuit (IC) package pins or pads that electrically couple a power supply voltage and a ground supply voltage to the n-wells and p-wells). Power supply routing region 620 can include interconnect routing for a power supply voltage (e.g., 0.4 V, 0.6 V, 0.7 V, 1.0 V, 1.2 V, 1.8 V, 2.4 V, 3.3 V, 5 V, and any other suitable voltage) and a ground supply voltage (e.g., 0 V) to memory cell region 310. The power supply voltage and ground supply voltage include voltages electrically coupled to PFET pull-up devices 260 and 270 and NFET pull-down devices 240 and 250 in memory cell 190 of FIG. 2.

In some embodiments, well pick-up region 610 can have a width 615 from about 4 CPP to about 8 CPP. For example, width 615 can be about 6 CPP. Power supply routing region 620 can have a width 625 from about 2 CPP to about 6 CPP, according to some embodiments of the present disclosure. For example, width 625 can be about 4 CPP. A ratio of width 615 to width 625 can be from about 2:3 to about 4:1. For example, width 615 can be about 6 CPP and width 625 can be about 4 CPP, which results in a ratio of width 615 to width 625 of about 3:2.

Referring to FIG. 3, second side 330 of memory cell region 310 is located on a near end of memory cell region 310, near or adjacent to device region 340 (e.g., in the x direction). For example, second side 330 of memory cell region 310 can be located on an inner portion of layout floorplan 300 for SRAM device 100. In some embodiments, second side 330 of memory cell region can have a width 335 (e.g., in the x direction) from about 5 CPP to about 7 CPP. For example, width 335 can be about 6 CPP.

Figure 7:
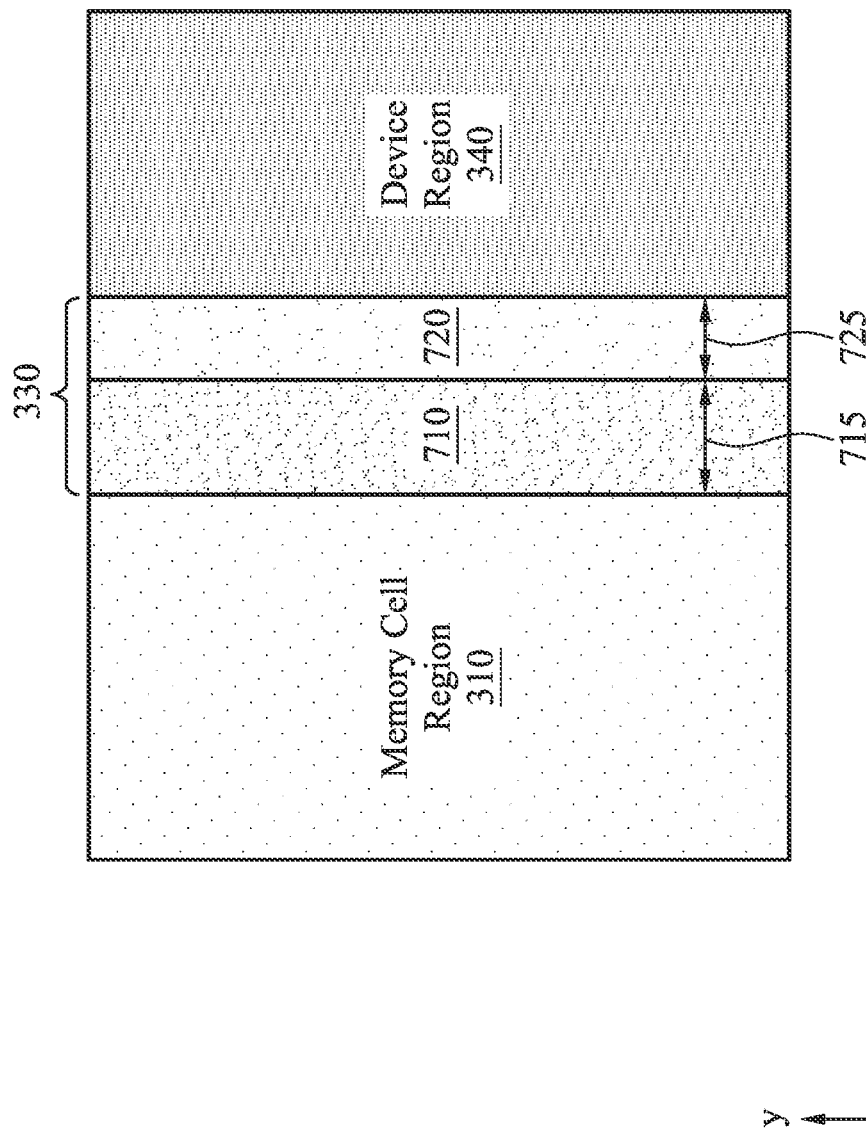
FIG. 7 is an illustration of a second side of a memory cell region in a static random access memory device, according to some embodiments of the present disclosure.

FIG. 7 is an illustration of second side 330 of memory cell region 310, according to some embodiments of the present disclosure. In some embodiments, second side 330 of memory cell region 310 includes a power supply routing region 710 and a bitline jumper routing region 720. Power supply routing region 710 can include interconnect routing for a power supply voltage (e.g., 0.4 V, 0.6 V, 0.7 V, 1.0 V, 1.2 V, 1.8 V, 2.4 V, 3.3 V, 5 V, and any other suitable voltage) and a ground supply voltage (e.g., 0 V) to memory cell region 310. The power supply voltage and ground supply voltage include voltages electrically coupled to PFET pull-up devices 260 and 270 and NFET pull-down devices 240 and 250 in memory cell 190 of FIG. 2. In some embodiments, power supply routing region 710 can provide interconnect routing for power supply voltage and ground supply voltage for a first set of memory cells 190 in memory cell region 310 and power supply routing region 620 of FIG. 6 can provide interconnect routing for power supply voltage and ground supply voltage for a second set of memory cells 190 in memory cell region 310. Bitline jumper routing region 720 provides a region for BLs and BLBs of memory cells 190 to be routed to other portions of SRAM device 100. In some embodiments, due to congestion in routing BLs and BLBs of memory cells 190 in a lower level interconnect (e.g., metal M0 interconnect), a higher level interconnect jumper (e.g., metal M1 interconnect) can be used to route the BLs and BLBs over one or more interconnect blocking the paths of the BLs and BLBs. The higher level interconnect jumper can route the lower level BL and BLB interconnects over the one or more blocking interconnects and connect the BL and BLB paths to lower level interconnects away from the interconnect congestion. For example, referring to FIG. 1 and when routing BLs and BLBs from memory cells 190 to read/write circuit 160, interconnect routing may be congested where a direct interconnect route (e.g., at the metal M0 interconnect level) may be challenging. In these instances, higher level interconnect jumpers (e.g., metal M1 interconnect) can be used to route the lower level BLs and BLBs to read/write circuit 160. In some embodiments, the higher level interconnect jumpers can be located in bitline jumper routing region 720 of FIG. 7.

In some embodiments, power supply routing region 710 can have a width 715 from about 2 CPP to about 6 CPP. For example, width 715 can be about 4 CPP. Bitline jumper routing region 720 can have a width 725 from about 1 CPP to about 3 CPP, according to some embodiments of the present disclosure. For example, width 725 can be about 2 CPP. A ratio of width 715 to width 725 can be from about 2:3 to about 6:1. For example, width 715 can be about 4 CPP and width 725 can be about 2 CPP, which result in a ratio of width 715 to width 725 of about 2:1.

Further, referring to FIGS. 3, 6, and 7, a ratio of width 325 to width 335 can be from about 8:7 to about 12:5. For example, the ratio of width 325 to width 335 can be about 5:3. As discussed above, width 325 is a combined width of well pick-up region 610 and power supply routing region 620, and width 335 is a combined width of power supply routing region 710 and bitline jumper routing region 720.

Referring to FIG. 3, device region 340 is adjacent to second side 330 of memory cell region 310. In some embodiments, device region 340 is in contact (e.g., in physical contact) with second side 330 of memory cell region 310. In some embodiments, device region 340 is adjacent to, but not in contact with, second side 330 of memory cell region 310. Referring to FIG. 7, device region 340 is adjacent to bitline jumper routing region 720. In some embodiments, device region 340 is in contact (e.g., in physical contact) with bitline jumper routing region 720. In some embodiments, device region 340 is adjacent to, but not in contact with, bitline jumper routing region 720. Device region 340 can include devices used to access memory cells in memory cell region 310, according to some embodiments of the present disclosure. For example, referring to FIG. 1, the devices can control access to memory cells 190, which include analog and logic devices in row decoder 120, wordline driver 130, column decoder 140, MUX 150, and read/write circuit 160.

Figure 8:
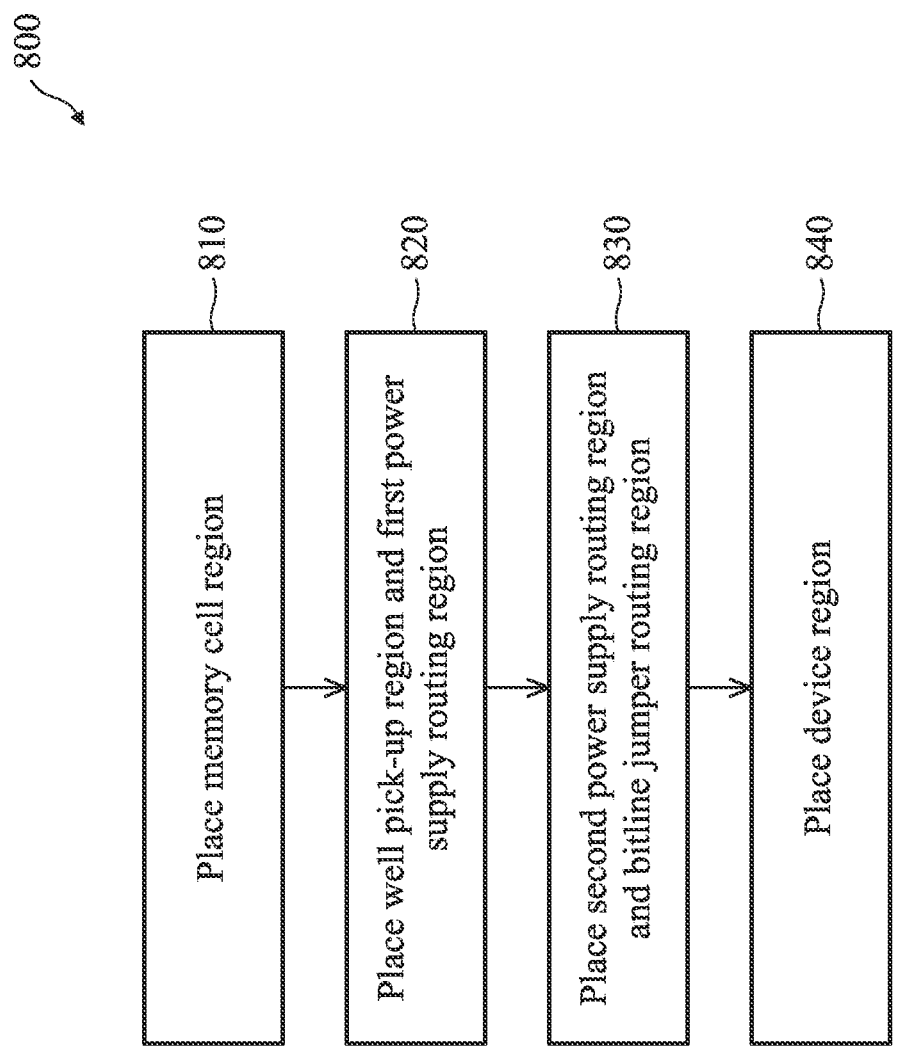
FIG. 8 is an illustration of a method for memory cell placement, according to some embodiments of the present disclosure.

FIG. 8 is an illustration of a method 800 for memory cell placement, according to some embodiments of the present disclosure. The operations depicted in method 800 can be performed by, for example, an EDA tool that operates on a computer system, such as an example computer system 900 described below with respect to FIG. 9. It is to be appreciated that not all operations may be needed to perform the disclosure provided herein and that one or more additional operations may be performed. Further, some of the operations may be performed concurrently or in a different order than shown in FIG. 8.

For explanation purposes, method 800 is described with respect to layout floorplan 300 of FIG. 3 and associated layout floorplans and circuit structures, such as those illustrated in FIGS. 1, 2, 4, 6, and 7. Other layout floorplans and circuit structures are applicable to method 300 and are within the spirit and scope of the present disclosure.

In operation 810, a memory cell region is placed in a layout area. For example, referring to layout floorplan 300 of FIG. 3, memory cell region 310 ("memory cell region") is placed in a layout area. In some embodiments, the placement of the memory cell region can include inserting one or more SRAM cells in the layout area. Each of the one or more SRAM cells can be composed of GAA FETs arranged in a 6T SRAM circuit topology, such as the circuit topology shown in memory cell 190 of FIG. 2.

Referring to method 800 of FIG. 8, in operation 820, a well pick-up region and a first power supply routing region are placed along a first side of the memory cell region. Referring to FIG. 6, first side 320 of memory cell region 310 is located on a far end of memory cell region, away from device region 340 (e.g., in the x direction). First side 320 of memory cell region 310 includes well pick-up region 610 ("well pick-up region") and power supply routing region 620 ("first power supply routing region"). Well pick-up region 610 has width 615 from about 4 CPP to about 8 CPP—e.g., width 615 can be about 6 CPP. In some embodiments, the placement of the well pick-up region can include inserting a p-well contact and/or n-well contact that are electrically coupled to the transistors in the memory cells (e.g., GAA FETs in memory cell 190 of FIG. 2). Power supply routing region 620 has width 625 from about 2 CPP to about 6 CPP—e.g., width 625 can be about 4 CPP—and includes routing for a power supply interconnect and/or a ground interconnect electrically coupled to the transistors in the memory cells (e.g., GAA FETs in memory cell 190 of FIG. 2). Further, in some embodiments, a ratio of width 615 to width 625 can be about 3:2.

Referring to method 800 of FIG. 8, in operation 830, a second power supply routing region and a bitline jumper routing region are placed along a second side of the memory cell region. The second side can be on the opposite side of the first side of the memory cell region. Referring to FIG. 7, second side 330 of memory cell region 310 is located on a near end of memory cell region 310, near or adjacent to device region 340 (e.g., in the x direction). Second side 330 of memory cell region 310 includes power supply routing region 710 ("second power supply routing region") and bitline jumper routing region 720 ("bitline jumper routing region"). Power supply routing region 710 has width 715 from about 2 CPP to about 6 CPP—e.g., width 715 can be about 4 CPP—and includes routing for a power supply interconnect and/or a ground interconnect electrically coupled to the transistors in the memory cells (e.g., GAA FETs in memory cell 190 of FIG. 2). Bitline jumper routing region 720 has width 725 from about 1 CPP to about 3 CPP—e.g., width 725 can be about 2 CPP—and includes routing for BLs and BLBs of memory cells 190 to other portions of SRAM device 100. Further, in some embodiments, a ratio of width 715 to width 725 can be about 2:1. Also, in some embodiments, a ratio of a combined width of well pick-up region 610 and power supply routing region 620 (cumulatively, first side 320 of memory cell region 310) to a combined width of power supply routing region 710 and bitline jumper routing region 720 (cumulatively, second side 330 of memory cell region 310) is about 5:3.

Referring to method 800 of FIG. 8, in operation 840, a device region is placed along the second side of the memory cell region, where the bitline jumper routing region is between the second power supply routing region and the device region. Referring to FIG. 3, device region 340 is adjacent to second side 330 of memory cell region 310. In some embodiments, device region 340 is in contact (e.g., in physical contact) with second side 330 of memory cell region 310. In some embodiments, device region 340 is adjacent to, but not in contact with, second side 330 of memory cell region 310. Device region 340 can include devices used to access memory cells in memory cell region 310, according to some embodiments of the present disclosure. For example, referring to FIG. 1, the devices can control access to memory cells 190, which include analog and logic devices in row decoder 120, wordline driver 130, column decoder 140, MUX 150, and read/write circuit 160.

Benefits of the embodiments described above, among others, include compact design and improved performance. As for the compact design, with a smaller bitline loading for SRAM device 100 (e.g., 4, 8, 16, or 32 memory cells electrically coupled to a bitline), the layout floorplan for SRAM device 100 can be smaller than that of a device with a larger bitline loading (e.g., 32, 64, 128, 256, or 512 memory cells electrically coupled to a bitline). Further, unlike other SRAM layout designs that require well pick-up regions on far end and near end of the memory cell region, embodiments of the present disclosure only require a single well pick-up region—e.g., located on the near end of the memory cell region (similar to the location of device region 340 in FIG. 3). The single well pick-up region SRAM design (e.g., well pick-up region 610 of FIG. 6) can be used because of the implementation of GAA FETs in the memory cell (e.g., memory cell 190 of FIG. 2). Specifically, GAA FETs have a larger source/drain region compared to other types of transistors (e.g., finFETs), thus lowering parasitic effects under the memory cell transistors (e.g., parasitic resistances) and mitigating the risk of latch-up. Further, as for improved performance, a smaller bitline loading for the SRAM device (e.g., 4, 8, 16, or 32 memory cells electrically coupled to a bitline) results in lower bitline RC delay as shown in graph 500 of FIG. 5. As a result, read and write performance in the SRAM device can be improved.

Figure 9:
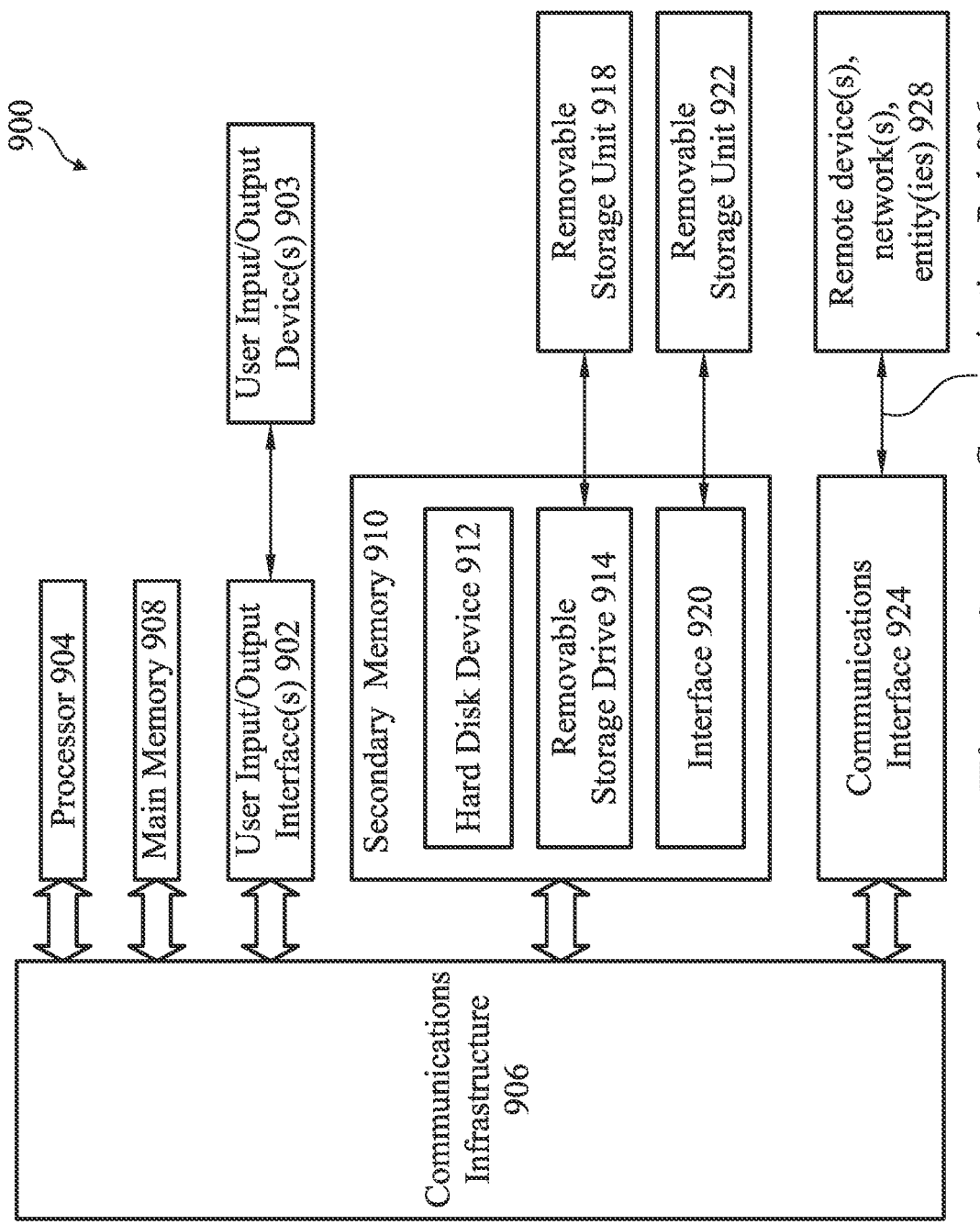
FIG. 9 is an illustration of an example computer system in which various embodiments of the present disclosure can be implemented, according to some embodiments of the present disclosure.

FIG. 9 is an illustration of an example computer system 900 in which various embodiments of the present disclosure can be implemented, according to some embodiments. Computer system 900 can be any well-known computer capable of performing the functions and operations described herein. For example, and without limitation, computer system 900 can be capable of placing memory cells in an IC layout design using, for example, an EDA tool. Computer system 900 can be used, for example, to execute one or more operations in method 800, which describes an example method for placing memory cells in a layout area.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., method 800 of FIG. 8—via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to method 800 of FIG. 8.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/any other computer data storage device. Removable storage drive 914 reads from and/or writes to removable storage unit 918 in a well-known manner.

In some embodiments, secondary memory 910 can include other means, instrumentalities or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to method 800 of FIG. 8.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding embodiments can be implemented in a wide variety of configurations and architectures. Therefore, some or all of the operations in the preceding embodiments—e.g., method 800 of FIG. 8—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein.

Figure 10:
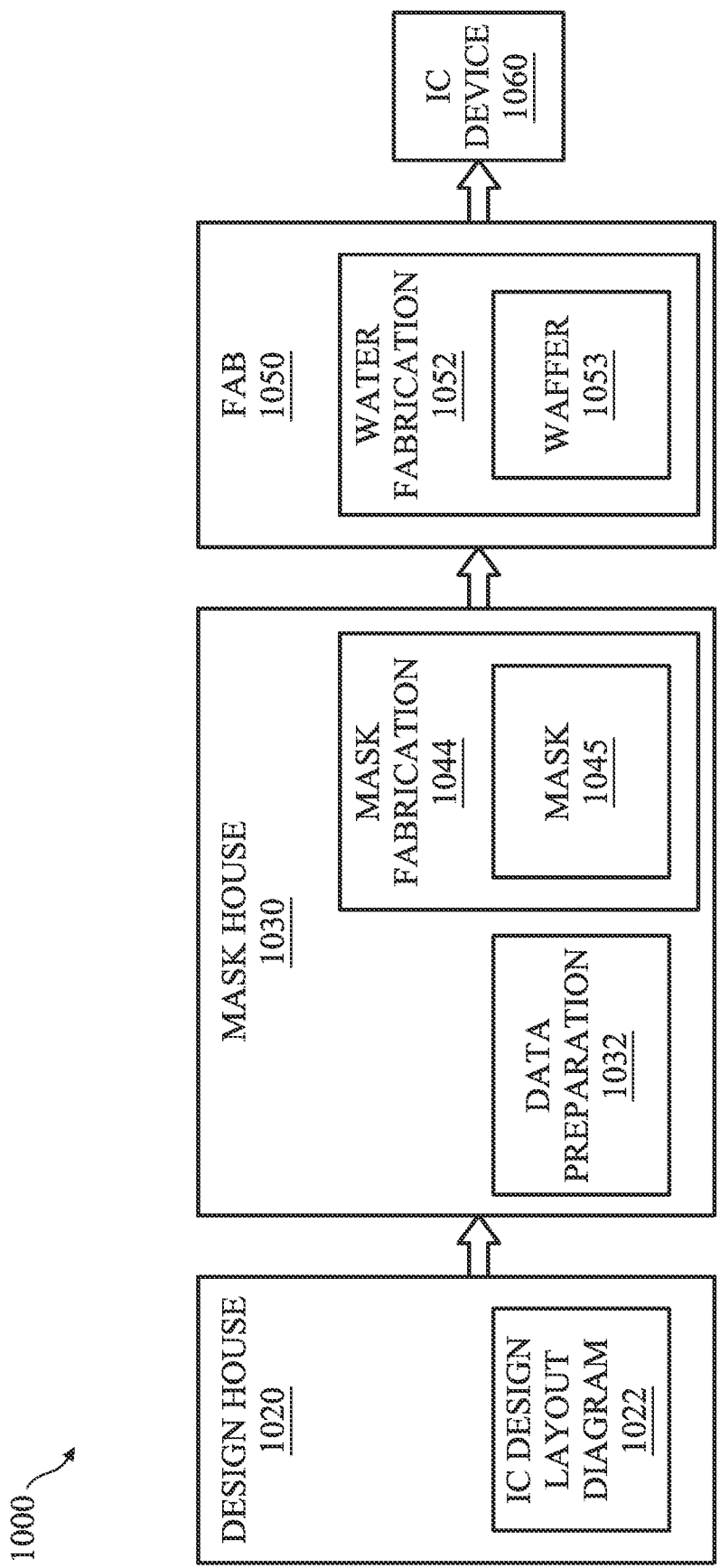
FIG. 10 is an illustration of an integrated circuit manufacturing system and associated integrated circuit manufacturing flow, according to some embodiments of the present disclosure.

FIG. 10 is an illustration of an IC manufacturing system 1000 and associated IC manufacturing flow, according to some embodiments. In some embodiments, the layouts described herein—e.g., layout floorplan 300 of FIG. 3 and associated layout floorplans and circuit structures—can be fabricated using IC manufacturing system 1000.

IC manufacturing system 1000 includes a design house 1020, a mask house 1030, and an IC manufacturer/fabricator ("fab") 1050—each of which interacts with one another in the design, development, and manufacturing cycles and/or services related to manufacturing an IC device 1060. Design house 1020, mask house 1030, and fab 1050 are connected by a communications network. In some embodiments, the communications network is a single network. In some embodiments, the communications network is a variety of different networks, such as an intranet and the Internet. The communications network includes wired and/or wireless communication channels. Each of design house 1020, mask house 1030, and fab 1050 interacts with one another and provides services to and/or receives services from one another. In some embodiments, two or more of design house 1020, mask house 1030, and fab 1050 coexist in a common facility and use common resources.

Design house 1020 generates an IC design layout diagram 1022. IC design layout diagram 1022 includes various geometrical patterns, such as those associated with layout floorplan 300 of FIG. 3 and associated layout floorplans and circuit structures. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, a gate electrode, a source and drain, and conductive segments or vias of an interlayer interconnection, to be formed in a semiconductor substrate (e.g., a silicon wafer) and various material layers disposed on the semiconductor substrate. Design house 1020 implements a proper design procedure to form IC design layout diagram 1022. The design procedure includes one or more of logic design, physical design, and place and route design. IC design layout diagram 1022 can be presented in one or more data files with information on the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer that converts the RDF to an image on a substrate, such as a mask (or reticle) 1045 or a semiconductor wafer 1053. IC design layout diagram 1022 can be manipulated by mask data preparation 1032 to comply with particular characteristics of the mask writer and/or requirements of fab 1050. In FIG. 10, data preparation 1032 and mask fabrication 1044 are illustrated as separate elements. In some embodiments, data preparation 1032 and mask fabrication 1044 can be collectively referred to as "mask data preparation."

In some embodiments, data preparation 1032 includes optical proximity correction (OPC), which uses lithography enhancement techniques to compensate for image errors, such as those that can arise from diffraction, interference, and other process effects. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and combinations thereof. In some embodiments, inverse lithography technology (ILT) can be used, which treats OPC as an inverse imaging problem.

In some embodiments, data preparation 1032 includes a mask rule checker (MRC) that checks whether IC design layout diagram 1022 has undergone OPC with a set of mask creation rules that include geometric and/or connectivity restrictions to ensure sufficient margins, to account for variability in semiconductor manufacturing processes. In some embodiments, the MRC modifies IC design layout diagram 1022 to compensate for limitations during mask fabrication 1044, which may undo part of the modifications performed by OPC to meet mask creation rules.

In some embodiments, data preparation 1032 includes lithography process checking (LPC) that simulates processing that will be implemented by fab 1050 to fabricate IC device 1060. LPC simulates this processing based on IC design layout diagram 1022 to create a simulated manufactured device, such as IC device 1060. The processing parameters in the LPC simulation can include parameters associated with various processes of the IC manufacturing cycle, parameters associated with tools used for IC manufacturing, and/or other aspects of the manufacturing process. LPC takes into account various factors, such as aerial image contrast, depth of focus (DOF), mask error enhancement factor (MEEF), and other suitable factors. In some embodiments, after a simulated manufactured device has been created by LPC and if the simulated device does not satisfy design rules, OPC and/or MRC are be repeated to further refine IC design layout diagram 1022.

In some embodiments, data preparation 1032 includes additional features, such as a logic operation (LOP) to modify IC design layout diagram 1022 based on manufacturing rules. Additionally, the processes applied to IC design layout diagram 1022 during data preparation 1032 may be executed in a different order than described above.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams are used to form a pattern on a mask (photomask or reticle) 1045 based on the modified IC design layout diagram 1022.

Mask 1045 can be formed by various technologies. In some embodiments, mask 1045 is formed using binary technology. In some embodiments, a mask pattern includes opaque regions and transparent regions. A radiation beam, such as an ultraviolet (UV) beam, can be used to expose the image sensitive material layer (e.g., photoresist) coated on a wafer. The radiation beam is blocked by the opaque region and transmits through the transparent regions. For example, a binary mask version of mask 1045 includes a transparent substrate (e.g., fused quartz) and an opaque material (e.g., chromium) coated in the opaque regions of the binary mask.

In some embodiments, mask 1045 is formed using a phase shift technology. In a phase shift mask (PSM) version of mask 1045, various features in the pattern formed on the phase shift mask are configured to have proper phase difference to enhance the resolution and imaging quality. For example, the phase shift mask can be attenuated PSM or alternating PSM.

The mask generated by mask fabrication 1044 is used in a variety of processes. For example, the mask can be used in an ion implantation process to form various doped regions in semiconductor wafer 1053, in an etching process to form various etching regions in semiconductor wafer 1053, and/or in other suitable processes.

Fab 1050 includes wafer fabrication 1052. Fab 1050 can include one or more manufacturing facilities for the fabrication of a variety of different IC products. In some embodiments, fab 1050 is a semiconductor foundry. For example, there may be a manufacturing facility for front-end fabrication of IC products (front-end-of-line (FEOL) fabrication), a second manufacturing facility to provide back end fabrication for the interconnection and packaging of the IC products (back-end-of-line (BEOL) fabrication), and a third manufacturing facility to provide other services for the foundry business.

Fab 1050 uses mask 1045 fabricated by mask house 1030 to fabricate IC device 1060. In some embodiments, semiconductor wafer 1053 is fabricated by fab 1050 using mask 1045 to form IC device 1060. In some embodiments, the IC fabrication includes performing one or more lithographic exposures based on IC design layout diagram 1022. Semiconductor wafer 1053 includes a silicon substrate or other appropriate substrate with material layers formed thereon. Semiconductor wafer 1053 further includes doped regions, dielectric features, multilevel interconnects, and other suitable features.

Embodiments of the present disclosure describe an optimized SRAM layout. Referring to FIGS. 3, 6, and 7, the SRAM layout include a memory cell region 310, a first side 320 of memory cell region 310 that includes well pick-up region 610 and power supply routing region 620, a second side 330 of memory cell region 310 that includes power supply routing region 710 and bitline jumper routing region 720, and a device region 340. Benefits of the SRAM layout, among others, include compact design and improved device performance. The SRAM layout can implement a smaller bitline loading (e.g., 4, 8, 16, or 32 memory cells electrically coupled to a bitline) as compared to a device with a larger bitline loading (e.g., 32, 64, 128, 256, or 512 memory cells electrically coupled to a bitline). Further, unlike other SRAM layout designs that require well pick-up regions on far end and near end of the memory cell region, the SRAM layout described herein only requires a single well pick-up region—e.g., located on the near end of the memory cell region (similar to the location of device region 340 in FIG. 3). The single well pick-up region SRAM design (e.g., well pick-up region 610 of FIG. 6) can be used because of the implementation of GAA FETs in the memory cell (e.g., memory cell 190 of FIG. 2). Further, as for improved performance, a smaller bitline loading for the SRAM device (e.g., 4, 8, 16, or 32 memory cells electrically coupled to a bitline) reduces lower bitline RC delay, thus improving read and write performance in the SRAM device.

Embodiments of the present disclosure include a method for cell placement. The method can include: placing a memory cell region in a layout area; placing, in the layout area, a well pick-up region and a first power supply routing region along a first side of the memory cell region; placing, in the layout area, a second power supply routing region and a bitline jumper routing region along a second side of the memory cell region, where the second side is on an opposite side to that of the first side; and placing, in the layout area, a device region along the second side of the memory cell region, where the bitline jumper routing region is between the second power supply routing region and the device region. The placements of the memory cell region, well pick-up region, first power supply routing region, second power supply routing region, bitline jumper routing region, and device region can be performed by one or more processors.

Embodiments of the present disclosure include a computer system that includes a memory and processor. The memory is configured to sore instructions. The processor that, when executing the instructions, is configured to perform operations that include: placing a memory cell region; placing a well pick-up region in contact with a first power supply routing region along a first side of a memory cell region; placing a second power supply routing region in contact with a bitline jumper routing region along a second side of the memory cell region, where the second side is on an opposite side to that of the first side; and placing a device region in contact with the bitline jumper routing region.

Embodiments of the present disclosure include a non-transitory computer-readable medium having instructions stored thereon that, when executed by a computing device, causes the computing device to perform operations. The operations include: placing static random access memory (SRAM) cells in a memory cell region, where the SRAM cells include gate all-around field effect transistors (GAA FETs); placing a well pick-up region and a first power supply routing region along a first side of the memory cell region, where the well pick-up region is electrically coupled to n-wells and p-wells of the gate all-around field effect transistors, and where the first power supply routing region includes first interconnects for a power supply voltage and a ground supply voltage electrically coupled to a first plurality of the GAA FETs; and placing a second power supply routing region and a bitline jumper routing region along a second side of the memory cell region, where the second power supply routing region includes second interconnects for a power supply voltage and a ground supply voltage electrically coupled to a second plurality of the GAA FETs, and where the bitline jumper routing region includes third interconnects electrically coupled to bitlines of the memory cells.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and of the present disclosure.

What is claimed is:

1. A method, comprising:
   placing, in a layout area, a power supply routing region and a bitline jumper routing region along a side of a device region, wherein the bitline jumper region is along a first side of the power supply routing region and between the power supply routing region and the device region; and
   placing, in the layout area, a memory cell region along a second side of the power supply routing region, wherein placing the power supply routing region, the bitline jumper routing region, and the memory cell region is performed by one or more processors.

2. The method of claim 1, further comprising:
   placing, in the layout area, an additional power supply routing region along a side of the memory cell region opposite to that of the power supply routing region, wherein placing the additional power supply routing region is performed by the one or more processors.

3. The method of claim 2, further comprising:
   placing, in the layout area, a well pick-up region along a side of the additional power supply region, wherein placing the well pick-up region is performed by the one or more processors.

4. The method of claim 1, wherein placing the power supply routing region comprises routing a power supply interconnect, a ground interconnect, or a combination thereof to electrically couple to one or more transistors in the memory cell region.

5. The method of claim 1, wherein placing the bitline jumper routing region comprises inserting one or more bitline jumper interconnects to electrically couple to one or more transistors in the memory cell region.

6. The method of claim 1, wherein placing the memory cell region comprises inserting one or more static random access memory (SRAM) cells in the layout area.

7. The method of claim 6, wherein inserting the one or more SRAM cells in the layout area comprises inserting a plurality of gate all-around field effect transistors in a 6-transistor SRAM circuit topology.

8. A computer system, comprising:
a memory configured to store instructions; and
a processor that, when executing the instructions, is configured to perform operations comprising:
placing, in a layout area, a power supply routing region and a bitline jumper routing region along a side of a device region, wherein the bitline jumper region is along a first side of the power supply routing region and between the power supply routing region and the device region; and
placing, in the layout area, a memory cell region along a second side of the power supply routing region, wherein placing the power supply routing region, the bitline jumper routing region, and the memory cell region is performed by one or more processors.

9. The computer system of claim 8, wherein the operations further comprise:
placing, in the layout area, an additional power supply routing region along a side of the memory cell region opposite to that of the power supply routing region, wherein placing the additional power supply routing region is performed by the one or more processors.

10. The computer system of claim 9, wherein the operations further comprise:
placing, in the layout area, a well pick-up region along a side of the additional power supply region, wherein placing the well pick-up region is performed by the one or more processors.

11. The computer system of claim 8, wherein placing the power supply routing region comprises routing a power supply interconnect, a ground interconnect, or a combination thereof to electrically couple to one or more transistors in the memory cell region.

12. The computer system of claim 8, wherein placing the bitline jumper routing region comprises inserting one or more bitline jumper interconnects to electrically couple to one or more transistors in the memory cell region.

13. The computer system of claim 8, wherein placing the memory cell region comprises inserting one or more static random access memory (SRAM) cells in the layout area.

14. The computer system of claim 13, wherein inserting the one or more SRAM cells in the layout area comprises inserting a plurality of gate all-around field effect transistors in a 6-transistor SRAM circuit topology.

15. A non-transitory computer-readable medium having instructions stored thereon that, when executed by a computing device, causes the computing device to perform operations, comprising:
placing, in a layout area, a power supply routing region and a bitline jumper routing region along a side of a device region, wherein the bitline jumper region is along a first side of the power supply routing region and between the power supply routing region and the device region; and
placing, in the layout area, a memory cell region along a second side of the power supply routing region, wherein placing the power supply routing region, the bitline jumper routing region, and the memory cell region is performed by one or more processors.

16. The non-transitory computer-readable medium of claim 15, wherein the operations further comprise:
placing, in the layout area, an additional power supply routing region along a side of the memory cell region opposite to that of the power supply routing region, wherein placing the additional power supply routing region is performed by the one or more processors.

17. The non-transitory computer-readable medium of claim 16, wherein the operations further comprise:
placing, in the layout area, a well pick-up region along a side of the additional power supply region, wherein placing the well pick-up region is performed by the one or more processors.

18. The non-transitory computer-readable medium of claim 15, wherein placing the power supply routing region comprises routing a power supply interconnect, a ground interconnect, or a combination thereof to electrically couple to one or more transistors in the memory cell region.

19. The non-transitory computer-readable medium of claim 15, wherein placing the bitline jumper routing region comprises inserting one or more bitline jumper interconnects to electrically couple to one or more transistors in the memory cell region.

20. The non-transitory computer-readable medium of claim 15, wherein placing the memory cell region comprises inserting one or more static random access memory (SRAM) cells in the layout area.

* * * * *